United States Patent

Takagi et al.

Patent Number: 6,096,438
Date of Patent: Aug. 1, 2000

[54] A1-N1-Y ALLOY FILMS FOR ELECTRODES OF SEMICONDUCTOR DEVICES AND SPUTTERING TARGETS FOR DEPOSITING THE A1-N1-Y ALLOY FILMS

[75] Inventors: Katsutoshi Takagi; Takashi Onishi, both of Kobe, Japan

[73] Assignee: Kabushiki Kaisha Kobe Seiko Sho, Kobe, Japan

[21] Appl. No.: 09/058,896

[22] Filed: Apr. 13, 1998

[30] Foreign Application Priority Data

Apr. 14, 1997 [JP] Japan ................................. 9-096038
Apr. 7, 1998 [JP] Japan ................................. 10-093780

[51] Int. Cl.[7] ................................................. C25D 11/04
[52] U.S. Cl. ................. 428/472.2; 148/415; 204/298.13; 420/550
[58] Field of Search ................................. 148/437, 415; 420/550; 75/10.21; 204/298.13; 428/472.2

[56] References Cited

U.S. PATENT DOCUMENTS 4,216,031  8/1980  Chia et al. .............................. 148/437
4,936,957  6/1990  Dickey et al. ......................... 204/37.1
5,053,085  10/1991  Masumoto et al. ................... 148/437
5,809,393  9/1998  Dunlop et al. ........................... 419/61

FOREIGN PATENT DOCUMENTS 7-011426   1/1995   Japan .
7-045555   2/1995   Japan .
7-301705   11/1995  Japan .
8-018060   1/1996   Japan .

*Primary Examiner*—George Wyszomierski
*Attorney, Agent, or Firm*—Reed Smith Hazel & Thomas LLP

[57] ABSTRACT

The invention provides an Al alloy film for use as an electrode of a semiconductor device and also provides an Al alloy sputtering target used to produce such an Al alloy film wherein the Al alloy film has not only a low resistivity equal to or less than 5 $\mu\Omega$cm and a high hillock resistance (property of hillock suppression) but also a high dielectric strength when it is anodized into an anodic oxide film and wherein the Al alloy film has a composition such that the Ni content is equal to or greater than 0.3 at % and the Y content is equal to or greater than 0.3 at % and such that 0.22 $C_{Ni}$+0.74 $C_Y$<1.6 at % where $C_{Ni}$ denotes the Ni content (at %) and $C_Y$ denotes the Y content (at %) and further wherein, in order to deposit the Al alloy film by sputtering, a spray forming Al alloy target containing Ni and Y is used.

20 Claims, 6 Drawing Sheets

Al-Ni-Y ALLOY FILMS FOR ELECTRODES OF SEMICONDUCTOR DEVICES AND SPUTTERING TARGETS FOR DEPOSITING THE Al-Ni-Y ALLOY FILMS

BACKGROUND OF THE INVENTION

1. Field of the Invention

The present invention relates to an Al—Ni—Y alloy thin film for use as electrode of semiconductor devices and to an Al—Ni—Y alloy target used to produce such an Al—Ni—Y alloy thin film. More particularly, the present invention relates to an Al—Ni—Y alloy film particularly suitable for forming electrodes (electrodes themselves and thin film interconnections) in an active matrix liquid crystal display and to a sputtering target used to produce such Al—Ni—Y alloy films.

2. Description of the Related Art

Liquid crystal displays (hereinafter referred to simply as LCDS) have the advantage of being smaller in thickness, being lighter in weight, and consuming less electric power than a conventional CRT display, and still being capable of displaying a high-resolution image. Liquid crystal displays are now widely used in many applications such as television sets and notebook-type personal computers. To improve the image quality such as resolution and contrast, it has been proposed to use thin film transistors (hereinafter referred to simply as TFTS) as switching elements of LCDs, and TFT-LCDs are now widely used. Herein, the TFT refers to an active device comprising a semiconductor film formed on an insulating substrate such as a glass substrate and also comprising electrodes (electrodes and interconnections in the form of a thin film) made of metal films wherein the electrodes are connected to the semiconductor film. That is, the term "electrode" of a semiconductor device is used to describe an electrode which is a part of a TFT wherein the "electrode" may be an electrode itself or an interconnection in the form of a thin film (the term "electrode" is used in a similar manner elsewhere in this description). In a TFT in a complete form finally obtained after the production process, interconnections are electrically connected to corresponding electrodes.

The film used to form the electrode of a semiconductor device in the LCD (hereinafter referred to simply as a electrode film) is required to have various characteristics. Of these various characteristics, low resistivity and high hillock resistance are particularly important. The importance of low resistivity is first described below. The resistivity of a material used to form the electrode film in the LCD has an influence on the signal pulse delay. Especially, if a material having a high resistivity is used to form the thin electrode, then the high resistivity causes a reduction in the conduction speed of the electric signal and thus an increase in the signal pulse delay. Such a signal pulse delay is an important factor which determines the overall characteristics of the LCD. In particular, in large-sized and high-resolution LCDs which are becoming popular recently, the low-resistivity is the most important factor to prevent the delay in the signal.

The hillock resistance is described below. The material used to form the electrode film is repeatedly subjected to annealing at 300° C. to 400° C. after the formation of the electrode film during the process of producing the film transistor. More specifically, in the LCD production, repeated annealings are required for example in the process of forming a silicon semiconductor layer after the formation of the electrode film. When aluminum is employed as the material to form the electrode film in the LCD, the problem is that small-sized hemispherical protrusions called hillocks are produced on the surface during plural heat treatments. The hillocks in the form of hemispherical protrusions are produced due to compressive stress caused by the difference in the thermal expansion coefficient between the glass substrate and the aluminum film. In TFT-LCDS, the electrode film is generally located at the bottom of the multilayer structure. Therefore, the hillocks on the electrode film make it impossible to form other films thereon in a flat shape. Furthermore, when an insulating film is formed on the electrode film, if hillocks are produced on the electrode film, the hillocks can protrude the insulating film and thus causing an electric short circuit (electric insulation failure) between layers.

Thus, in addition to the property of low resistivity, the material for the electrode film in the LCD is required to have the property that no hillocks are produced during annealings. To meet the above requirement, a refractory metal such as Ta, Mo, Cr, or Ti is used as the electrode material of an LCD on which TFTs are mounted (hereinafter such a type of LCD is referred to as a TFT-LCD). However, although these materials are excellent in the property of producing less hillocks (herein such a property is referred to as "hillock resistance"), they have a high electric resistivity when they are in the form of a film. More specifically, the resistivities of pure Ta, Mo, Cr, and Ti film are about 180, 50, 50, and 80 $\mu\Omega$cm, respectively. These values are much higher than the required value or 5 $\mu\Omega$cm.

The electrode materials for semiconductor devices having a low resistivity include Au, Cu, and Al. However, Au is difficult to etch into a desired pattern after depositing it into the form of a film or electrode film (interconnection film). The other disadvantage of Au is its high cost. Cu is poor in its adhesion to a substrate and also poor in corrosion resistance. Thus Au and Cu are not suitable in practical use. On the other hand, Al is poor in the hillock resistance.

In view of the above, the inventors of the present invention have proposed an electrode material for semiconductor devices which is excellent in both the low resistivity and the hillock resistance. That is, a film made of an Al alloy such as Al—Ta and Al—Ti has been disclosed in Japanese Unexamined Patent Publication No. Hei 5-100248, and a film made of an Al—Fe alloy or an Al alloy containing an element of similar to Fe (the element may be one of or two or more elements selected from the group consisting of Fe, Co, Ni, Nd, Ru, Rh, and Ir, hereinafter such alloys are collectively referred to as Al—Fe or -similar element alloy) has been disclosed in Japanese Unexamined Patent Publication No. Hei7-45555.

In recent technology of LCDs, there is an increasing tendency toward a larger size of the panel and a higher resolution. As a result of such a tendency, it has become required to form the electrode film of the LCD into smaller dimensions. Such a change in the shape toward smaller dimensions results in an increase in the electric resistance of interconnections and electrodes thus resulting in an increase in the delay time of the electric signals, which brings about a great problem in realizing high-performance LCDs. To suppress the signal pulse delay, caused by the reduction in the size of the film electrode in the LCD, to a sufficiently low level to be applicable to color LCDs in particular to large-sized color LCDs having a panel size of for example 10 inches or greater, it is required that the electric resistivity of the electrodes of semiconductor devices should be equal to or less than 5 $\mu\Omega$cm.

When a film is made of an Al alloy such as Al—Ta, Al—Ti, or Al—Nd or Al—Fe or -similar element alloy, or although the high hillock resistance is improved by the presence of Ta, Ti, Fe or similar elements, or Nd in the alloy, the presence of such an element in the alloy also causes an increase in the electric resistivity. Therefore, such an Al alloy cannot satisfy both requirements in terms of the low resistivity less than 5 $\mu\Omega$cm and the high hillock resistance.

As described above, the electrode film is generally subjected to repeated annealings during the LCD production process. The material of the electrode film is required to have a high hillock resistance during the repeated annealings. However, although the thin film made of an alloy such as Al—Ta, Al—Ti, Al—Fe or -similar element alloy, or Al—Nd has a high hillock resistance during the first annealing, hillocks are produced during the second or the following annealings. That is, the film made of this type of alloy is not sufficient in the hillock resistance against repeated annealings.

An attempt has recently been made to employ, as a gate insulating film, an anodic oxide film formed by anodizing an Al alloy of the type described above. In this technique, in addition to the requirement that the Al alloy film should have a low electric resistivity less than 5 $\mu\Omega$cm and should have a excellent hillock resistance, there is an additional requirement that the anodic oxide film formed by anodizing the Al alloy should have a high dielectric strength. However, the alloy film made of Al—Ta, Al—Ti, Al—Fe or -similar element alloy, or Al—Nd cannot meet all requirements in terms of the low resistivity less than 5 $\mu\Omega$cm, the high hillock resistance, and the high dielectric strength of the anodic oxide film.

Especially, the gate insulating film of thin film transistors used as switching elements in LCDs is required to have a high dielectric strength between adjacent layers. In the conventional techniques, a SiN film is employed as the gate insulating film. However, when SiN is employed, it is difficult to produce a SiN film which is perfectly free of pin holes. The dielectric strength of the SiN film is reduced by these pin holes or defects caused by particles generated during the process of depositing the SiN film. Therefore, it is difficult to obtain a sufficiently high dielectric strength using only the SiN film. To solve the above problem, the recent gate insulating film is generally formed into a two-layer structure consisting of an anodic oxide film and a SiN film deposited thereon.

Furthermore, in order to simplify the LCD production process, there is an attempt to replace the 2-layer gate insulating film with a single-layer gate insulating film made of an anodic oxide film. In this case, it is required that the anodic oxide gate insulating film formed by anodizing the electrode film of the alloy of the above-described type should have a high dielectric strength similar to that obtained in the SiN film. Especially, it is required that the anodic oxide film formed by anodizing the electrode film made of the above-described alloy should have a dielectric breakdown voltage higher than a voltage applied during the anodization process. If the dielectric breakdown voltage of the anodic oxide film is lower than the voltage applied during the anodization process, then an electric short circuit (electric insulation failure) is produced through the gate insulating film of TFTs, which can cause the TFTs not to operate normally. However, when an aluminum alloy such as Al—Ta, Al—Ti, Al—Nd, or Al—Fe or -similar element alloy described above is employed as the material of the alloy film, the resultant anodic oxide film does not have a sufficient dielectric strength similar to that obtained in the SiN film, and thus it is impossible to produce the gate insulating film into the single-layer structure made of the anodic oxide film.

As described above, the conventionally used thin film materials cannot satisfy all requirements needed as the electrode film of an LCD. That is, any known thin film material used to form the electrode film of the LCD cannot satisfy all requirements in terms of the low resistivity, the high hillock resistance, and the high dielectric strength of the anodic oxide film

SUMMARY OF THE INVENTION

In view of the above, it is an object of the present invention to provide an Al alloy film used to form an electrode of a semiconductor device and an Al alloy sputtering target used to deposit such an Al alloy film, no longer having problems which are encountered in the conventional Al alloy films, and meeting all requirements needed as the electrode film used in LCDs in terms of the low electric resistivity equal to or less than 5 $\mu\Omega$cm, the high hillock resistance against repeated annealings, and the high dielectric strength of the anodic oxide film similar to that of SiN films. According to an aspect of the present invention, to achieve the above object, there is provided an Al alloy film used as an electrode of a semiconductor device wherein the Al alloy film comprising an Al alloy film including alloying elements which are such that the Ni content is equal to or greater than 0.3 at % and the Y content is equal to or greater than 0.3 at % and such that 0.22 $C_{Ni}$+0.74 $C_Y \leq 1.6$ at % where $C_{Ni}$ denotes the Ni content (at %) and $C_Y$ denotes the Y content (at %).

If the Al alloy film used as the electrode of a semiconductor device is formed so that it has a composition satisfying the above conditions, then the Al alloy film meets all requirements in terms of the low electric resistivity less than 5 $\mu\Omega$cm and the high hillock resistance of the Al alloy film and also the high dielectric strength of the anodic oxide film formed by anodizing the Al alloy film.

In the Al alloy film for use as the electrode of a semiconductor device according to the present invention, the alloy elements Ni and Y in a state of a solid solution may be partly or wholly precipitated as intermetallic compounds such as $Al_3Ni$, $Al_3Y$, or $Ni_2Y_3$ thereby reducing the electric resistivity of the Al alloy film to a low level equal to or less than 5 $\mu\Omega$cm.

Furthermore, in the present invention, an Al alloy containing alloying elements of Ni and Y may be employed as a sputtering target used to produce the Al—Ni—Y alloy film for use as the electrode of a semiconductor device. Preferably, the alloy components of the sputtering target are such that the Ni content is equal to or greater than 0.3 at % and the Y content is equal to or greater than 0.3 at % and such that 0.22 $C_{Ni}$+0.74 $C_Y \leq 1.6$ at % where $C_{Ni}$ denotes the Ni content (at %) and $C_Y$ denotes the Y content (at %).

DETAILED DESCRIPTION OF THE PREFERRED EMBODIMENTS

Figure 1:
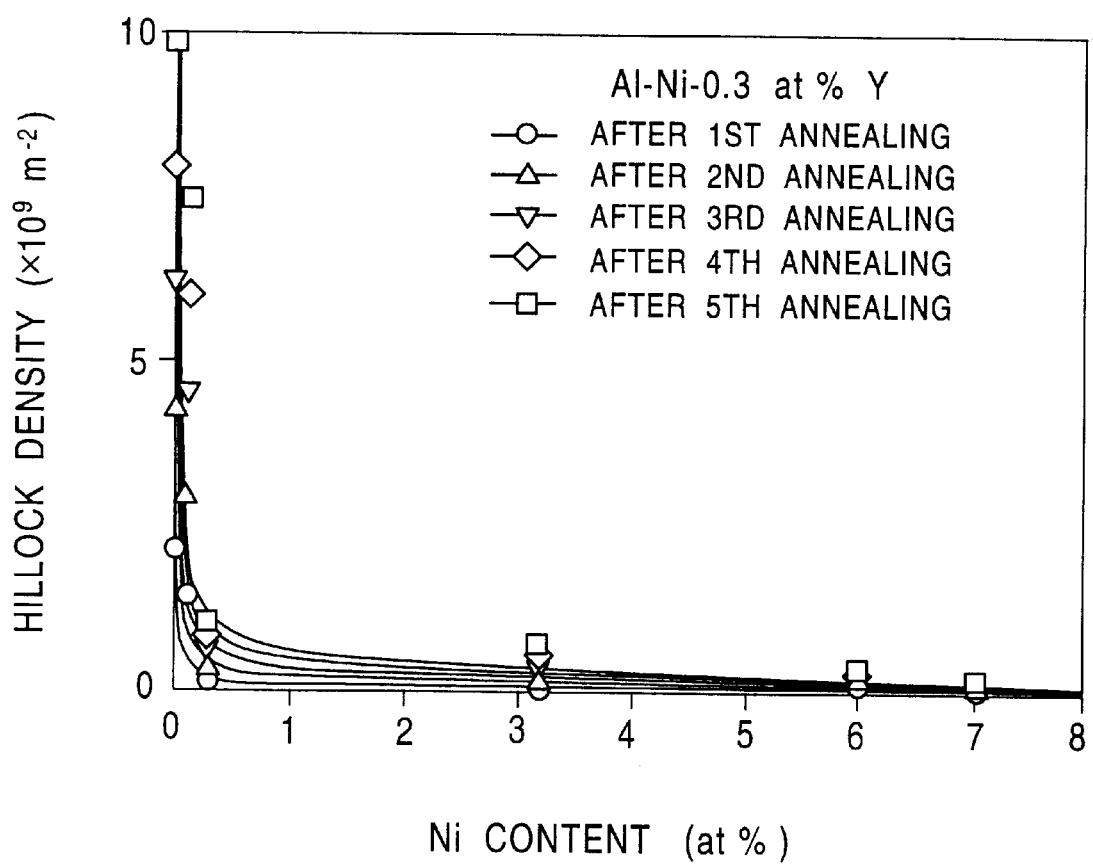
FIG. 1 is a graph illustrating the influence of the Ni content of an Al alloy film on the hillock density.

Our inventors of the present invention have prepared Al alloy films having various compositions by means of a sputtering technique using Al alloy targets containing various alloying elements, and have evaluated them from the view point of the electric resistivity, the hillock resistance, and the dielectric strength of anodic oxide films. The experiment has revealed that an alloy film having a particular composition of Al—Ni—Y is excellent in the hillock resistance. That is, substantially no hillocks are generated when the film is subjected to repeated annealings after the deposition of the film (electrode film). Furthermore, it has also been revealed that this Al alloy film has the property that its resistivity is reduced by the annealings. The Al—Ni—Y alloy film having the particular composition meets all requirements in terms of the high hillock resistance, the low electric resistivity, and the high dielectric strength of the anodic oxide film, at any time before, during, and after the annealing. The present invention has been established based on the above-described knowledge obtained through the experiment.

Now, the reason why a low resistivity such as 5 $\mu\Omega$cm or lower is obtained in the Al—Ni—Y alloy film is described below. In the Al alloy film deposited by sputtering, the elements of the alloy are generally contained in the resultant film in the form of solid solution into aluminum. In the Al alloy film, conduction electrons are scattered by alloy elements in the solid solution, and thus a great increase in the resistivity occurs. Although Ni and Y in the Al—Ni—Y alloy film according to the present invention are also such alloy elements that are contained in the form of solid solution into Al and that cause an increase in the resistivity, the degree of the influence on the resistivity increase is smaller than that of elements Ta, Ti, and Nd, and Fe and similar elements described above. Although in the as-deposited Al—Ni—Y alloy film, Ni and Y are contained in the film in the form of solid solution into Al, Ni and Y contained in the form of solid solution are partially or absolutely precipitated into the form of intermetallic compounds such as $Al_3Ni$, $Al_3Y$, or $Ni_2Y_3$ when the alloy film is subjected to annealings. As a result, a low resistivity such as 5 $\mu\Omega$cm or lower can be obtained after the annealings. The intermetallic compounds are precipitated either at crystal grain boundaries or in the crystal grains, or otherwise both at crystal grain boundaries and in the crystal grains wherein the grain sizes of the intermetallic compounds are less than 0.1 $\mu$m.

The reason why the Al—Ni—Y alloy thin film according to the present invention has the property of producing little hillocks (high hillock resistance) during the repetition of annealings is described below. In the Al alloy film deposited by sputtering, the alloying elements of Ni and Y are contained in Al (matrix) in the form of solid solution, and thus enhancement of the strength occurs due to the alloy elements in the solid solution. As a result, the Al—Ni—Y alloy film of the invention has a greater yield stress than the above-described alloy films of Al—Ta, Al—Ti, Al—Fe or -similar element, and Al—Nd. Furthermore, the inclusion of Ni and Y makes Al have a smaller grain size which results in an increase in the strength thus an increase in the yield stress of the Al—Ni—Y alloy film.

When the Al—Ni—Y alloy film is subjected to a first heat treatment, the increase in the strength due to the solid solution and due to the reduction in the grain size makes the Al—Ni—Y alloy film have a high yield stress. As a result, the generation of hillocks which are one type of plastic deformation is suppressed. In other words, the Al—Ni—Y alloy film has a high hillock resistance against the annealing. When the first annealing is completed, the Al—Ni—Y alloy film has come into a state in which Ni and Y are partially or absolutely precipitated into the form of intermetallic compounds such as $Al_3Ni$, $Al_3Y$, or $Ni_2Y_3$. The strength has been increased due to the precipitation of the intermetallic compounds, and thus the Al—Ni—Y alloy film has come to have a high yield stress. Therefore, the Al—Ni—Y alloy film has a high hillock resistance during the following annealings (the second and following annealings) due to the high yield stress achieved by the increase in the strength caused by the precipitation of the intermetallic compounds.

If the contents of Ni and Y are increased, the degree of the enhancement in the strength, caused by the solid solution, by the decrease in the grain size, and by the precipitation of the intermetallic compounds, increases and thus the yield stress of the Al—Ni—Y alloy film increases. As a result, the Al—Ni—Y alloy film has a higher hillock resistance. When the contents of Ni and Y are increased, the increase in the electric resistivity due to the increase in the Ni content is smaller than the increase in the electric resistivity due to the increase in the Y content. Therefore it is desirable that the content of Ni rather than Y should be increased to achieve a high hillock resistance without causing a significant increase in the electric resistivity thus satisfying the requirement that the electric resistivity should be less than 5 $\mu\Omega$cm. Especially, it is desirable that the content of Ni be greater than 0.3 at % to achieve a sufficiently high hillock resistance.

The reason why the anodic oxide film formed by anodizing the Al—Ni—Y alloy film according to the present invention has a high dielectric strength is described below. When an Al—Ni alloy film without Y is anodized, the alloy element Ni is not anodized during the anodization process, but Ni is incorporated in the form of ions into the anodic oxide film. The Ni ions cause the anodic oxide film to have electric conductivity although the conductivity is not very high. Therefore, the anodic oxide film of the Al—Ni alloy film cannot have a high dielectric strength. To increase the hillock resistance, it is desirable, as described above, to increase the Ni content. However, to make the anodic oxide film sufficiently high in the dielectric strength, the inclusion of Ni into the anodic oxide film is undesirable. To prevent the anodic oxide film from having degradation in the dielectric strength due to the inclusion of Ni, it is desirable that the Ni content should be less than 4 at %. From the above discussion, it is concluded that the preferable Ni content is within the range of 0.3 to 4 at %.

In the Al—Ni—Y alloy film according to the present invention, Y plays a special role in preventing Ni from being incorporated into the anodic oxide film. Especially, in the Al—Ni—Y alloy film, various oxides of Al and Y such as $Al_2Y_4O_9$, $AlYO_3$, and $Al_5Y_3O_{12}$ are produced at the beginning of the anodic oxidation process. These oxides form a barrier layer which prevents Ni ions from being incorporated into the anodic oxide film. As a result, a high dielectric strength is achieved. Furthermore, the various oxides of Al and Y contained partly or wholly in the anodic oxide film also contribute to the high dielectric strength. In this anodic oxide film, the dielectric strength increases with the Y content. Furthermore, with the increase in the Y content, the density of defects such as pin holes or extrusions on the surface the anodic oxide film decreases, and the surface of the anodic oxide film becomes flatter. As described above, the anodic oxide film of Al—Ni—Y alloy according to the present invention has a high dielectric strength, similar to that of the SiN film, required when used as the gate insulating film. That is, this film has a dielectric breakdown voltage greater than the voltage applied during the anodic oxidation process. The ratio (content) of the various oxides of Al and Y relative to the total amount of alloying elements is preferably 0.2 through 3 at %.

The roles of Ni and Y have been described above. Now the requirements in terms of the contents of Ni and Y in the Al—Ni—Y alloy film according to the present invention are described below. The content of Ni should be greater than 0.3 at %. FIG. 1 illustrates the influence of the Ni content of the Al—Ni—Y alloy film on the hillock density (the number of hillocks per unit area) generated during annealings (thermal history) wherein the Ni content is changed within the range from 0 to 7 at % while maintaining the Y content at 0.3 at %. The result shown in FIG. 1 is obtained for the Al—Ni—Y alloy films produced in the similar manner in which an Al—Ni—Y alloy film is produced according to the second embodiment described below. As can be seen from FIG. 1, when the Ni content is less than 0.3 at %, a remarkable increase in the hillock density occurs. That is, if the Ni content is less than 0.3 at %, the effect of Ni on the enhancement of the hillock resistance is not sufficient to achieve a low hillock density. From this point of view, it is required that the Ni content should be greater than 0.3 at %.

Figure 2:
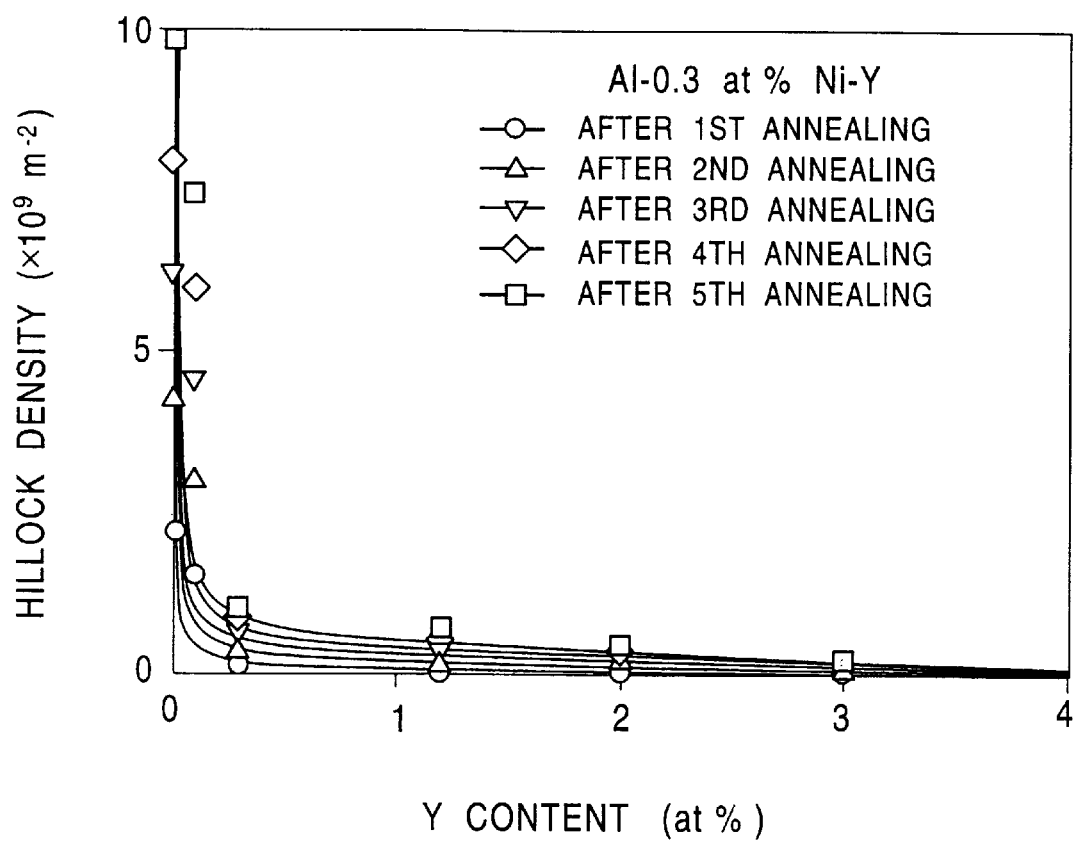
FIG. 2 is a graph illustrating the influence of the Y content of an Al alloy film on the hillock density.

The content of Y should be greater than 0.3 at %. FIG. 2 illustrates the influence of the Y content of the Al—Ni—Y alloy film on the hillock density generated during annealings (thermal history) wherein the Y content is changed within the range from 0 to 3 at % while maintaining the Ni content at 0.3 at %. The result shown in FIG. 2 is obtained for the thin Al—Ni—Y alloy films produced in the similar manner as the second embodiment. As can be seen from FIG. 2, when the Y content is less than 0.3 at %, a drastic increase in the hillock density occurs. That is, if the Y content is less than 0.3 at %, the effect of Y on the enhancement of the hillock resistance is not sufficient to achieve a low hillock density. From this point of view, and to make the anodic oxide film have a sufficiently high dielectric strength, it is required that the Y content should be greater than 0.3 at %.

Figure 3:
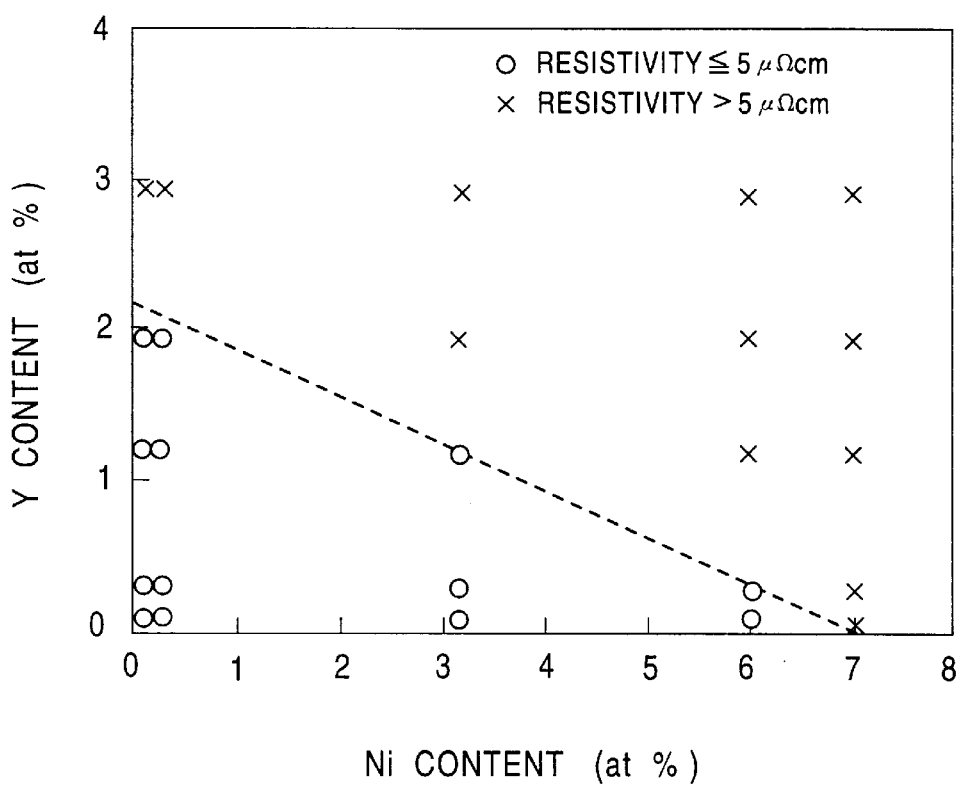
FIG. 3 is a graph illustrating the influence of the contents of Ni and Y of an Al alloy film on the resistivity.

The total content of Ni and Y should be selected such that $0.22 C_{Ni}+0.74 C_Y<1.6$ at % where $C_{Ni}$ is the Ni content (at %) and $C_Y$ is the Y content (at %). Our inventors of the present invention have found that the electric resistivity depends on the content of Ni and that of Y as shown in FIG. 3. On the broken line in FIG. 3, $0.22 C_{Ni}+0.74 C_Y$ has a constant value of 1.6 at %. In the area above this broken line (where $0.22 C_{Ni}+0.74 C_Y>1.6$ at %), a great increase in the electric resistivity occurs (as represented by symbols x) and it is impossible to obtain an electric resistivity lower than 5 $\mu\Omega$cm. Conversely, in the area below the broken line in FIG. 3 (where $0.22 C_{Ni}+0.74 C_Y<1.6$ at %), it is possible to obtain an electric resistivity lower than 5 $\mu\Omega$cm as represented by symbols ○. From the above discussion, it is concluded that the total content of Ni and Y should be selected so that $0.22 C_{Ni}+0.74 C_Y \leq 1.6$ at %. This result shown in FIG. 3 is obtained by rearranging the results of samples Nos. 1–25 shown in Table 1, which were prepared according to the first embodiment described later.

In the Al—Ni—Y alloy film according to the present invention, in order to achieve not only a resistivity lower than 5 $\mu\Omega$cm but also a high hillock resistance and a high dielectric strength in the anodic oxide film, the desirable composition of the Al—Ni—Y alloy film is such that the Ni content is 1.5 to 3.7 at % and the Y content is 1.0 to 1.6 at %. In order to achieve a still lower resistivity less than 4 $\mu\Omega$cm while also achieving a high hillock resistance and a high dielectric strength in the anodic oxide film, it is desirable that the composition of the Al—Ni—Y alloy film be such that the Ni content is 0.5 to 1.2 at % and the Y content is 0.4 to 0.6 at %. In the present invention, the Al—Ni—Y alloy film may contain, in addition to the alloying elements such as Ni and Y, various metal elements or impurity elements such as oxygen which may be incorporated inevitably or not inevitably during the process of producing a target used to deposit the thin film or during the process of depositing the film as long as the inclusion of such an element does not results in significant degradation in any characteristic of the Al—Ni—Y alloy film of the invention. However, the inclusion of such an impurity can generally bring about degradation in the characteristic of the film, such as an increase in the resistivity. Therefore, the inclusion of impurities should be suppressed to as low a level as possible. In particular, the inclusion of oxygen should be suppressed to a very low level because oxygen forms $Al_2O_3$ in the film, which causes a problem of an increase in the resistivity of the film. More specifically, the maximum oxygen content allowed to be included in the Al—Ni—Y alloy film without causing significant degradation in its characteristics is 1000 ppm. Furthermore, the maximum allowable total content of various impurities (other than Ni and Y) is 1000 ppm.

As described above, the Al—Ni—Y alloy film according to the present invention is excellent in various characteristics. Therefore, this Al—Ni—Y alloy film is suitable as the electrode mate rial of semiconductor devices in particular for use in LCDs (liquid crystal displays) in which the electrode material needs a resistivity lower than 5 $\mu\Omega$cm, a high hillock resistance, and a high dielectric strength of the anodic oxide film.

The method of depositing the Al—Ni—Y alloy film according to the present invention is described below. Preferably, the Al—Ni—Y alloy film is deposited by means of sputtering. Although other methods such as vacuum evaporation, ion plating, and chemical vapor deposition may also be employed, the sputtering technique is excellent in that the Al—Ni—Y alloy film deposited by the sputtering has good uniformity of the Ni and Y contents. The solubility limit of alloy elements Ni and Y in Al in an equilibrium state is extremely small. However, in films deposited by sputtering, Ni and Y are forced to be incorporated into Al to a high level beyond the solid solubility in the equilibrium state. Such high concentrations of Ni and Y included in the form of solid solution in Al result in an increase in yield strength. As a result, the Al—Ni—Y alloy film deposited by sputtering has a higher hillock resistance than Al alloy films deposited by other film formation methods.

In the present invention, an Al alloy containing Ni and Y is preferably used as a target in the sputtering process of depositing the Al—Ni—Y alloy film. Especially, the preferable composition of the Al alloy target is such that the Ni content is equal to or greater than 0.3 at % and the Y content is equal to or greater than 0.3 at % and such that $0.22 C_{Ni}+0.74 C_Y<1.6$ at %. By employing such a target material having a composition similar to that of the Al alloy film to be deposited, it is ensured that the Al alloy film deposited has a desired composition of Ni and Y with a good uniformity and with good repeatability and thus it is ensured that the resultant Al alloy film has good characteristics.

The Al alloy target material may be obtained by producing an ingot from an Al alloy melt using a melt casting technique, or blowing an Al alloy melt with a high-pressure inert gas in a chamber filled with an inert gas by means of a spray forming technique so that semi-solidified Al alloy particles are deposited on a tray thereby forming a billet. The ingot or billet may be used as the target or may be formed into a desired shape. In this target in the form of the Al alloy ingot, alloy components such as Ni and Y are solid-dissolved or dispersed uniformly over the entire Al matrix. That is, the target is produced into the form of a single ingot having an uniform composition and containing little oxygen. Thus, in contrast to a composite target produced by placing separate Ni and Y chips on an Al base plate, the target according to the invention has the advantage of being capable of precisely controlling the composition of the resultant Al alloy film with good repeatability and also capable of producing an Al alloy film containing little oxygen.

As described above, the Al—Ni—Y alloy film of the present invention is deposited by means of sputtering technique or the like. At the stage as deposited, the alloy components Ni and Y contained in the deposited film are partly or wholly in the solid solution state. When the Al alloy film is subjected to annealing, the alloying elements in the solid solution state are partly or wholly precipitated as intermetallic compounds, and thus a sufficiently high hillock resistance and a sufficiently low electric resistivity are achieved. In other words, the Al—Ni—Y alloy film of the invention takes advantage of annealings (at 300 to 400° C.) which are inevitable in the process performed after the deposition of the Al—Ni—Y alloy film to produce film transistors or other elements during the production process of LCDs so that intermetallic compounds are precipitated thereby improving the characteristics of the film. This is one of features of the present invention.

The degree of the precipitation of Ni and Y contained in the solid solution state into intermetallic compounds during the annealing is determined by the thermal history, the amount of elements contained in the solid solution state, the required hillock resistance, and the required resistivity. In order for Ni and Y to be precipitated as intermetallic compounds, it is required that the anealings should be performed at 150° C. or above. However, if the annealings are performed at a temperature of 400° C. or above, hillocks are generated during the heat treatments. Although the temperature of the annealings is determined depending on the requirements in the LCD production, the maximum allowable temperature of the annealings should be 150 to 400° C. from the point of view of the present invention.

EMBODIMENTS

[Embodiment 1]

Alloy films with a thickness of 350 nm and having various compositions of Al-x at % Ni-y at % Y (x=0.1 to 7 and y=0.1 to 3) were deposited on substrates made of Corning No. 7059 glass with a thickness of 0.5 mm and a diameter of 50 mm by means of a DC magnetron sputtering using vacuum melted Al—Ni—Y alloy targets containing proper amounts of Ni and Y. The composition of the obtained Al—Ni—Y alloy films was analyzed by ICP. Then the films were patterned into a resistivity test pattern with a length of 10 mm and a width of 100 $\mu$m by means of a wet etching process (using a mixed solution of $H_3PO_4$: $HNO_3$: $H_2O$=75: 5: 20 as an etchant) in conjunction with photolithography. The films were then subjected to a annealing at a constant temperature of 300° C. for 0.5 hr in a vacuum ambient (at a pressure lower than $2.0 \times 10^{-6}$ Torr) using a hot-wall furnace.

After annealing, the resistivity of the thin films was measured using the four-point probe method. The composition of the Al—Ni—Y alloy films and the resistivity thereof are shown in Table 1.

In samples Nos. 7–9, 12, 13, and 17 prepared according to the present invention, the Ni content is equal to or greater than 0.3 at %, the Y content is equal to or greater than 0.3 at %, and 0.22 $C_{Ni}$+0.74 $C_Y$<1.6 at %. These samples all satisfy the requirement of the present invention, and thus a low resistivity equal to or less than 5 $\mu\Omega$cm was achieved, on the other hand, in samples Nos. 5, 10, 14, 15, 18–25 prepared for the purpose of comparison, some condition was greater than the upper limit allowed in the present invention, and thus the resistivity was greater than 5 $\mu\Omega$cm. In samples Nos. 1–4, 6, 11, and 16 prepared for the purpose of comparison in which either the Ni content or the Y content was lower than 0.3 at %, although a low resistivity equal to or less than 5 $\mu\Omega$cm was obtained, a sufficiently high hillock resistance was not obtained, because the Ni content was less than 0.3 at % and thus the effect of the inclusion of Ni on the enhancement of the hillock resistance was not sufficient. In the case where the Y content was less than 0.3 at %, the effects of the inclusion of Y on the enhancement of the hillock resistance and on the enhancement of the dielectric strength were not sufficient.

TABLE 1

| Sample No. | Technique | Ni Content (at %) | Y Content (at %) | 0.22$C_{Ni}$ + 0.74$C_Y$ (at %) | Resistivity ($\mu\Omega$cm) |
|---|---|---|---|---|---|
| 1 | COMP | 0.1 | 0.1 | 0.10 | 3.5 |
| 2 | COMP | 0.1 | 0.3 | 0.24 | 3.7 |
| 3 | COMP | 0.1 | 1.2 | 0.91 | 4.4 |
| 4 | COMP | 0.1 | 2 | 1.50 | 5.0 |
| 5 | COMP | 0.1 | 3 | 2.24 | 5.7 |
| 6 | COMP | 0.3 | 0.1 | 0.14 | 3.6 |
| 7 | INV | 0.3 | 0.3 | 0.29 | 3.7 |
| 8 | INV | 0.3 | 1.2 | 0.95 | 4.4 |
| 9 | INV | 0.3 | 2 | 1.55 | 5.0 |
| 10 | COMP | 0.3 | 3 | 2.29 | 5.7 |
| 11 | COMP | 3.2 | 0.1 | 0.78 | 4.2 |
| 12 | INV | 3.2 | 0.3 | 0.93 | 4.4 |
| 13 | INV | 3.2 | 1.2 | 1.59 | 5.0 |
| 14 | COMP | 3.2 | 2 | 2.18 | 5.6 |
| 15 | COMP | 3.2 | 3 | 2.92 | 6.4 |
| 16 | COMP | 6 | 0.1 | 1.39 | 4.9 |
| 17 | INV | 6 | 0.3 | 1.54 | 5.0 |
| 18 | COMP | 6 | 1.2 | 2.21 | 5.7 |
| 19 | COMP | 6 | 2 | 2.80 | 6.3 |
| 20 | COMP | 6 | 3 | 3.54 | 7.0 |
| 21 | COMP | 7 | 0.1 | 1.61 | 5.1 |
| 22 | COMP | 7 | 0.3 | 1.76 | 5.2 |
| 23 | COMP | 7 | 1.2 | 2.43 | 5.9 |
| 24 | COMP | 7 | 2 | 3.02 | 6.5 |
| 25 | COMP | 7 | 3 | 3.76 | 7.2 |

(Notes: "INV" indicates that the sample was prepared according to the invention, and "COMP" indicates that the sample was prepared for the purpose of comparison.)

[Embodiment 2]

Figure 4:
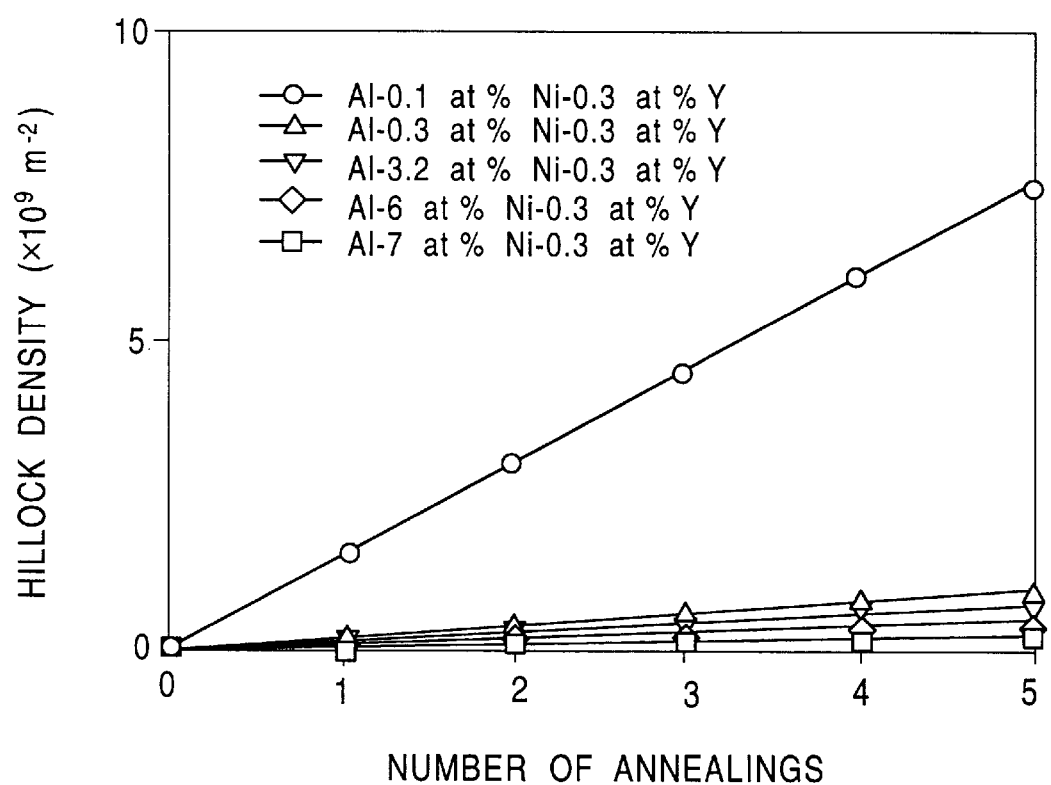
FIG. 4 is a graph illustrating the relationship between the hillock density of Al alloy films produced according to a second embodiment of the present invention and the number of annealings performed on the Al alloy films.

Alloy films with a thickness of 350 nm and having various compositions Al-x at % Ni-0.3 at % Y (x=0.1 to 7) were deposited on substrates made of Corning No. 7059 glass with a thickness of 0.5 mm and a diameter of 50 mm by DC magnetron sputtering using vacuum melted Al—Ni—Y alloy targets containing proper amounts of Ni and Y. The composition of the obtained Al—Ni—Y alloy films was analyzed by ICP. Then the films were patterned into a resistivity test pattern with a a width of 10 $\mu$m by means of a wet etching process (using a mixed solution of $H_3PO_4$: $HNO_3$: $H_2O$=75: 5: 20 as an etchant) in conjunction with photolithography. The films were then subjected repeatedly (5 times) to an annealing at a constant temperature of 300° C. for 0.5 hr in a vacuum ambient (at a pressure lower than 2.0×10$^{-6}$ Torr) using the hot-wall furnace. The surface of the obtained thin films was observed under a microscope, and the hillocks density (the number of hillocks per unit area) generated during the annealings was determined. FIG. 4 illustrates the relationship between the hillock density (×10$^9$m$^{-2}$) of the films subjected to the annealing(s) and the number of annealings.

As can be seen from FIG. 4, in a sample having a composition of Al-0.1 at % Ni-0.3 at % Y (denoted by a symbol ○ in FIG. 4, and corresponding to the sample No. 2 in Table 1, prepared for the purpose of comparison), an increase in the hillock density with the number of heat treatments was observed. This is because the Ni content was less than the lower (allowable) limit of 0.3 at %. On the other hand, in samples having a Ni content greater than the lower (allowable) limit of 0.3 at % (denoted by symbols Δ, ∇, ◊, □, corresponding to the samples Nos. 7, 12, 17, and 22 in Table 1), no significant increase in the hillock density with the number of annealings was observed. From the above results, it can be concluded that the Ni content of the film should be equal to or greater than 0.3 at % to obtain sufficiently high hillock resistance against plural annealings. In FIG. 4, symbols Δ, ∇, and ◊ denote samples prepared according to the present invention, having compositions of Al-0.3 at % Ni-0.3 at % Y (corresponding to sample No. 7 in Table 1), Al-3.2 at % Ni-0.3 at % Y (corresponding to sample No. 12 in Table 1), and Al-6 at % Ni-0.3 at % Y (corresponding to sample No. 17 in Table 1), respectively. Although the sample denoted by symbol □ having a composition of Al-7 at % Ni-0.3 at % Y (corresponding to sample No. 22 in Table 1) had also no significant increase in the hillock density, this sample had another problem that the electric resistivity was greater than 5 μΩcm because 0.22 CNi+0.74 C$_Y$ was greater than 1.6.

[Embodiment 3]

Figure 5:
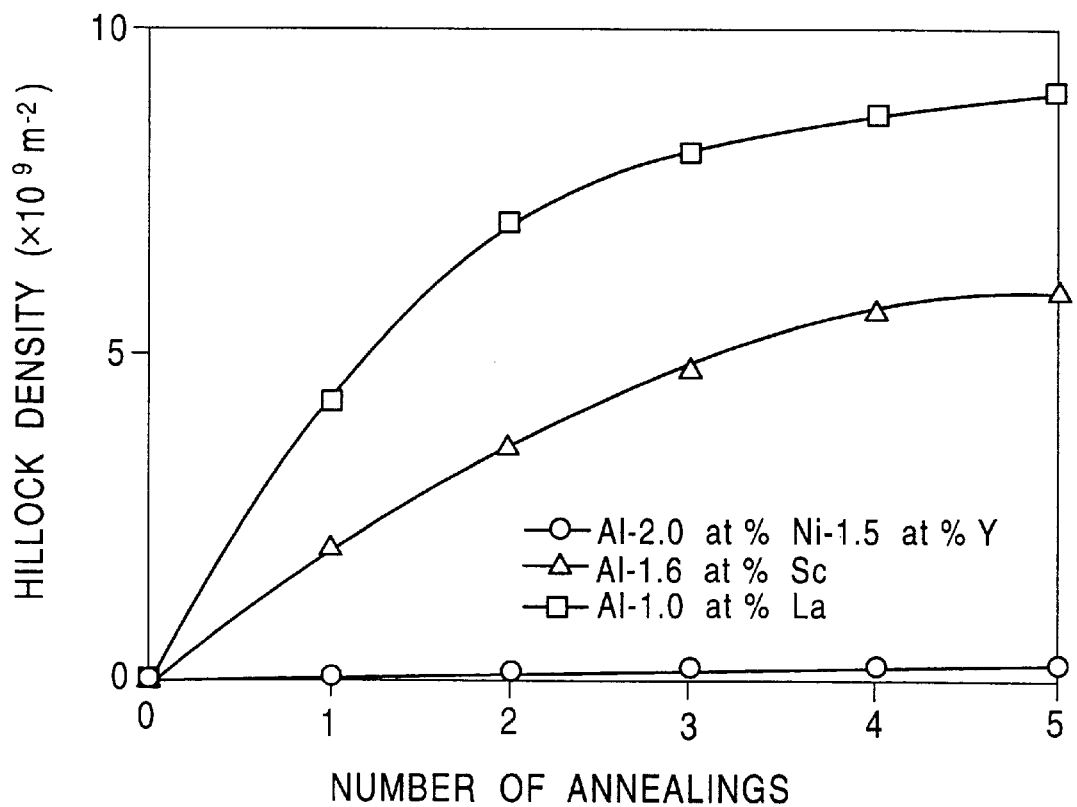
FIG. 5 is a graph illustrating the relationship between the hillock density of Al alloy films produced according to a third embodiment of the present invention and the number of annealings performed on the Al alloy films.

Alloy films with a thickness of 350 nm and having compositions of Al-2.0 at % Ni-1.5 at % Y, Al-1.6 at % Sc, and Al-1.0 at % La were deposited on substrates made of Corning No. 7059 glass with a thickness of 0.5 mm and a diameter of 50 mm by DC magnetron sputtering using Al—Ni—Y alloy targets containing proper amounts of Ni and Y according to the invention and also Al—Sc and of Al—La alloy targets as reference standards. The composition of the obtained Al alloy films was analyzed by ICP. The n the films were patterned into a resistivity test pattern with a width of 10 μm by means of a wet etching process (using a mixed solution of H$_3$PO$_4$: HNO$_3$: H$_2$O=75: 5: 20 as an etchant) in conjunction with photolithography. The films were then subjected repeatedly (5 times) to an annealing at a constant temperature of 300° C. for 0.5 hr in a vacuum ambient (at a pressure lower than 2.0×10$^{-6}$ Torr) using the hot-wall furnace. The surface of the obtained films was observed under a microscope, and the hillock density (the number of hillocks per unit area) generated during the annealings was determined. FIG. 5 illustrates the relationship between the hillock density (×10$^9$m$^{-2}$) of the thin films subjected to the heat treatment(s) and the number of annealings.

As can be seen from FIG. 5, in a sample of an alloy film having a composition of Al-1.6 at % Sc (denoted by a symbol Δ in FIG. 5) and a sample of an alloy film having a composition of Al-1.0 at % La (denoted by a symbol □ in FIG. 5), an increase in the hillock density with the number of annealings was observed. In contrast, in a sample of Al-2.0 at % Ni-1.5 at % Y alloy film (denoted by a symbol ○ in FIG. 5), no significant increase in the hillock density with the number of annealings was observed. This means that the Al—Ni—Y alloy film according to the present invention has a high hillock resistance against plural annealings.

[Embodiment 4]

Alloy films with a thickness of 350 nm and having compositions of Al-0.3 at % Ni-y at % Y (y=0.1 to 3) and Al-0.3 at % Ni were deposited on substrates made of Corning No. 7059 glass with a thickness of 0.5 mm and a diameter of 50 mm by DC magnetron sputtering using Al—Ni—Y alloy targets containing proper amounts of Ni and Y according to the invention and also Al—Ni alloy targets for the purpose of comparison. The composition of the obtained Al alloy films was analyzed by ICP. Then, the films were patterned into a resistivity test pattern with a width of 100 μm by means of a wet etching process (using a mixed solution of H$_3$PO$_4$: HNO$_3$: H$_2$O=75: 5: 20 as an etchant) in conjunction with photolithography.

The film pattern was then anodized thereby forming an anodic oxide film having a thickness of 200 nm. The anodization was performed using a mixture of tartaric acid and ethylene glycol (3.0 wt % tartaric acid: ethylene glycol= 10: 90) as an electrolyte. The anodic oxide film was grown by passing a current at a current density of 0.2 mA/cm$^2$. The film thickness was made uniform by applying a voltage of 80 V for 10 min. on this electrode film having the anodic oxide film formed in this way, an upper electrode film having a composition Al-0.3 at % Ni-y at % Y (y=0.1 to 0.3) or Al-0.3 at % Ni was formed so that the upper electrode film had the same composition as the lower electrode film. The upper electrode film was patterned by means of wet etching in conjunction with photolithography into a straight pattern with a width of 100 μm extending in a direction perpendicular to the lower electrode pattern thereby forming a dielectric breakdown voltage test pattern having a three-layer structure of lower electrode film/anodic oxide film/ upper electrode film (with an electrode area of 100 μm×100 μm). A voltage was applied across the anodic oxide film and the dielectric breakdown voltage of the anodic oxide film was measured. The result is shown in Table 2 and in FIG. 6.

TABLE 2

| Type of Al Alloy Film Ni, Y Content | | Dielectric Breakdown |
|---|---|---|
| Ni Content (at %) | Y Content (at %) | Voltage (V) |
| 0.3 | — | 40.0 |
| 0.3 | 0.1 | 60.0 |
| 0.3 | 0.3 | 87.0 |
| 0.3 | 1.2 | 94.0 |
| 0.3 | 2 | 101 |
| 0.3 | 3 | 108 |

Figure 6:
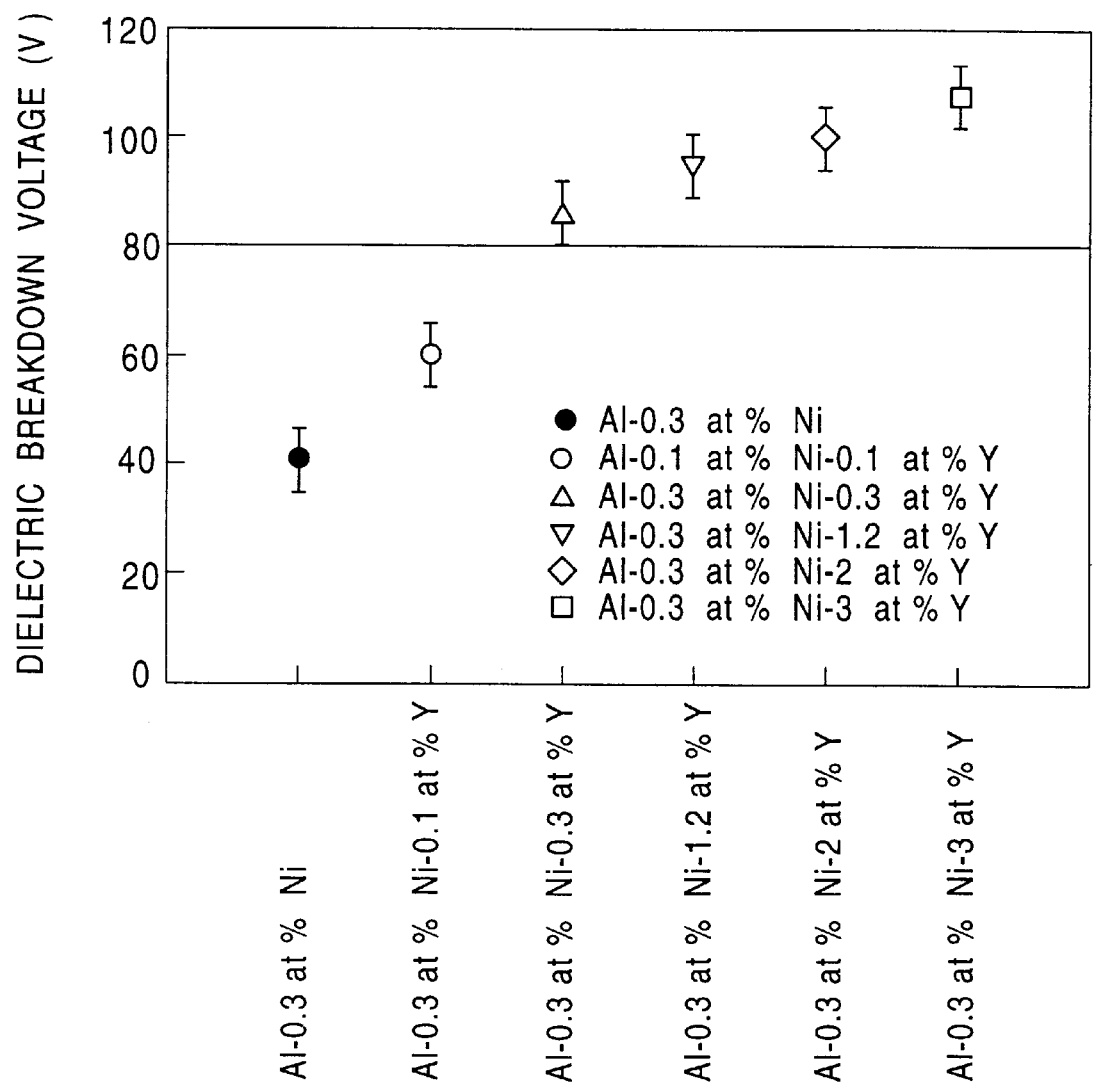
FIG. 6 is a graph illustrating the dielectric breakdown voltage of anodic oxide films formed by anodizing Al alloy films according to a fourth embodiment of the present invention.

As can be seen from Table 2 and FIG. 6, the anodic oxide films of Al-0.3 at % Ni-y at % Y alloys (y=0.1 to 3, denoted by symbols ○, Δ, ∇, ◊, □) showed a higher dielectric breakdown voltage than the anodic oxide film of the Al-0.3 at % Ni alloy film without Y (denoted by ●). However, of the anodic oxide films of the Al—Ni—Y alloy films, the anodic oxide film of the Al-0.3 at % Ni-0.1 at % Y alloy film (denoted by ○, corresponding to sample No. 6 in Table 1), whose content of Y was 0.1 at % and thus was less than the lower allowable limit of the content of Y, showed a low dielectric breakdown voltage less than the voltage of 80 V applied during the anodization process. That is, this sample is low in the dielectric breakdown voltage in contrast to the high dielectric breakdown voltage greater than 80 V obtained in the anodic oxide films whose content of Y is equal to or greater than 0.3 at % (Δ, ∇, ◊, □). From this result, it is concluded that the Y content should be equal to or greater than 0.3 at % to achieve a sufficiently high dielectric strength. In FIG. 6, symbols Δ, ∇, and ◊ denote samples prepared according to the present invention, having compositions of Al-0.3 at % Ni-0.3 at % Y (corresponding to sample No. 7 in Table 1), Al-0.3 at % Ni-1.2 at % Y (corresponding to sample No. 8 in Table 1), and Al-0.3 at % Ni-2 at % Y (corresponding to sample No. 9 in Table 1), respectively. Although the sample denoted by symbol □ having a composition of Al-0.3 at % Ni-3 at % Y (corresponding to sample No. 10 in Table 1) had also a high dielectric breakdown voltage, this sample had another problem that the electric resistivity was greater than 5 μΩcm because the Y content was greater than the upper allowable limit of 2 at %. Thus, the lower allowable limit of the dielectric breakdown voltage is 80 V in this specific embodiment. The dielectric breakdown voltage of the anodic oxide film decreases with the reduction in the thickness. To achieve a sufficiently high dielectric strength at the lower limit of the film thickness of 20 nm, the dielectric breakdown voltage should be at least 15 V.

The Al alloy film for use as an electrode of a semiconductor device according to the present invention is formed to have a particular composition as described above, and thus the resultant film has a high hillock resistance against a plurality of annealings performed after the formation of the film, and the electric resistivity becomes low through the annealings. The Al alloy film according to the present invention meets not only the requirements in terms of the high hillock resistance at any time before, during, and after the annealings and a low electric resistivity, but also meets the requirement that the anodic oxide film formed by anodizing the Al alloy film has a high dielectric breakdown voltage. Thus the Al alloy film of the present invention can be advantageously used to form electrodes of semiconductor devices for use in an electronic device using a film transistor such as an active matrixed liquid crystal display (LCD). The employment of the Al alloy film of the present invention allows the electronic device to be improved in its functions and performance. Furthermore, the Al alloy film of the present invention may be employed in high-resolution and larger-sized liquid crystal display devices which will be realized in the future.

The sputtering target according to the present invention can be advantageously used to form the above-described electrode of the semiconductor device by means of sputtering so that the composition of the electrode is controlled precisely with good repeatability thereby ensuring that the resultant electrode of the semiconductor has good characteristics.

The entire disclosure of Japanese Patent Application Nos. Hei 9-96038 filed on Apr. 14, 1997 and Hei 10-93780 filed on Apr. 7, 1998 including specification, claims, drawings and summary are incorporated herein by reference in its entirety.

What is claimed is:

1. A low-resistivity Al—Ni—Y Alloy film for an electrode of a semiconductor device, comprising:

an Al alloy film having Ni content and Y content as alloying elements, wherein the Ni content is equal to or greater than 0.3 at % and the Y content is equal to or greater than 0.3 at % such that $0.22\,C_{Ni}+0.74\,C_Y \leq 1.6$ at % where $C_{Ni}$ denotes the Ni content (at %) and $C_Y$ denotes the Y content (at %), and wherein said Al alloy film with the alloying content thereof is formed with a resistivity equal to or less than 5 μΩcm.

2. A low-resistivity Al—Ni—Y Alloy film for an electrode of a semiconductor device, comprising:

an Al alloy film having Ni content and Y content as alloying elements, wherein the Ni content is equal to or greater than 0.3 at % and the Y content is equal to or greater that 0.3 at % and such that $0.22\,C_{Ni}+0.74\,C_Y \leq 1.6$ at % where $C_{Ni}$ denotes the Ni content (at %) and $C_Y$ denotes the Y content (at %); and an anodic oxide film formed on said Al alloy film, wherein said Al alloy film with the alloying elements thereof is formed with a resistivity equal to or less than 5 μΩcm and a high hillock resistance against annealing and a high dielectric strength.

3. A low-resistivity Al—Ni—Y alloy film according to claim 2, wherein said anodic oxide film has a thickness of 20 to 500 nm.

4. A low-resistivity Al—Ni—Y alloy film according to any of claims 1 to 3, wherein said Al—Ni—Y alloy film has been formed by sputtering.

5. A low-resistivity Al—Ni—Y alloy film according to claim 4, comprising Ni and Y precipitated as intermetallic compounds in said alloy film.

6. A low-resistivity Al—Ni—Y alloy film according to claim 5, comprising said intermetallic compounds of Ni and Y precipitated by annealing said alloy film.

7. A low-resistivity Al—Ni—Y alloy film according to claim 4, wherein said anodic oxide film has a dielectric breakdown voltage higher than a limiting anodization voltage during a process of forming said anodic oxide film.

8. A low-resistivity Al—Ni—Y alloy film according to claim 4, wherein said electrode of the semiconductor device is for use in a liquid crystal display.

9. A low-resistivity Al—Ni—Y alloy film according to any of claims 1 to 3, comprising Ni and Y precipitated as intermetallic compounds in said alloy film.

10. A low-resistivity Al—Ni—Y alloy film according to claim 9, comprising said intermetallic compounds of Ni and Y precipitated by annealing said alloy film.

11. A low-resistivity Al—Ni—Y alloy film according to claim 9, wherein said anodic oxide film has a dielectric breakdown voltage higher than a limiting anodization voltage during a process of forming said anodic oxide film.

12. A low-resistivity Al—Ni—Y alloy film according to claim 9, wherein said electrode of the semiconductor device is for use in a liquid crystal display.

13. A low-resistivity Al—Ni—Y alloy film according to any of claims 5, 6, or 10, wherein said anodic oxide film has a dielectric breakdown voltage higher than a limiting anodization voltage during a process of forming said anodic oxide film.

14. A low-resistivity Al—Ni—Y alloy film according to any of claims 5, 6, 7, 10, and 11, wherein said electrode of the semiconductor device is for use in a liquid crystal display.

15. A low-resistivity Al—Ni—Y alloy film according to any of claims 1 to 3, wherein said electrode of the semiconductor device is for use in a liquid crystal display.

16. A low-resistivity Al—Ni—Y alloy film according to claim 2 or 3, wherein said anodic oxide film has a dielectric breakdown voltage higher than a limiting anodization voltage during a process of forming said anodic oxide film.

17. A low-resistivity Al—Ni—Y alloy film according to claim 16, wherein said electrode of the semiconductor device is for use in a liquid crystal display.

18. A sputtering target for depositing an Al—Ni—Y alloy electrode of a semiconductor device, comprising an Al alloy having Ni content and Y content as alloying elements, wherein the Ni content is equal to or greater than 0.3 at % and Y content is equal to or greater that 0.3 at % and such that $0.22\,C_{Ni}+0.74\,C_Y \leq 1.6$ at % where $C_{Ni}$ denotes the Ni content (at %) and $C_Y$ denotes the Y content (at %).

19. A sputtering target according to claim 18, wherein said target comprises an Al alloy produced by means of melt casting or spray forming.

20. A sputtering target according to claim 18 or 19, wherein said electrode of the semiconductor device is for use in a liquid crystal display.

* * * * *